United States Patent
Jang et al.

(10) Patent No.: US 7,227,425 B2
(45) Date of Patent: Jun. 5, 2007

(54) DUAL-BAND VOLTAGE CONTROLLED OSCILLATOR UTILIZING SWITCHED FEEDBACK TECHNOLOGY

(75) Inventors: Sheng-Lyang Jang, Taipei (TW); Shao-Hua Lee, Danshuei Township, Taipei County (TW)

(73) Assignee: National Taiwan University of Science and Technology, Taipei (TW)

( * ) Notice: Subject to any disclaimer, the term of this patent is extended or adjusted under 35 U.S.C. 154(b) by 47 days.

(21) Appl. No.: 11/292,546

(22) Filed: Dec. 2, 2005

(65) Prior Publication Data
US 2007/0075799 A1 Apr. 5, 2007

(30) Foreign Application Priority Data
Oct. 4, 2005 (TW) .............................. 94134707 A

(51) Int. Cl.
*H03B 5/12* (2006.01)
(52) U.S. Cl. .................................. 331/179; 331/117 R
(58) Field of Classification Search ................ 331/179
See application file for complete search history.

(56) References Cited
U.S. PATENT DOCUMENTS
5,872,489 A * 2/1999 Chang et al. ............... 331/179
6,853,257 B2 * 2/2005 Yonekawa et al. ............ 331/17
2002/0125958 A1 * 9/2002 Ikarashi ......................... 331/2

* cited by examiner

Primary Examiner—Joseph Chang
(74) Attorney, Agent, or Firm—Thomas, Kayden, Horstemeyer & Risley

(57) ABSTRACT

The present invention is related with a dual-band LC voltage controlled oscillator, which utilizes a substantial amount of feedback loop paths in the circuit. The circuit is a core of a substantial amount of communication ICs. The voltage controlled oscillator can provide wide-band or dual-band radio frequency generation, and it utilizes a switch controlled circuit to select one of the feedback loops in order to choose the assigned frequency band output. Generic wide-band or dual-band LC voltage controlled oscillations are obtained by switching parallel-connected capacitors or switching inductor array, in contrast, the present invention is used for switching several parallel connected feedback loops, each of which associated with an LC tank forms an oscillation frequency output. Utilizing the switch to control the feedback loop and integrating different band oscillator circuit is capable of saving chip's size and power consumption.

16 Claims, 6 Drawing Sheets

DUAL-BAND VOLTAGE CONTROLLED OSCILLATOR UTILIZING SWITCHED FEEDBACK TECHNOLOGY

RELATED APPLICATIONS

The present application is based on, and claims priority from, Taiwan Application Serial Number 94134707, filed Oct. 4, 2005, the disclosure of which is hereby incorporated by reference herein in its entirety.

BACKGROUND OF THE INVENTION

1. Field of Invention

The invention relates to a dual-band voltage controlled oscillator and, in particular, to a dual-band voltage controlled oscillator utilizing the switched feedback loop technology.

2. Related Art

Due to rapid development in wireless communication systems, there is an increasing need for integrating multiple bands in communication system chips. Therefore, it is important in radio-frequency transceiving circuits to provide a dual-band oscillating source or an oscillator circuit with wide-band oscillating sources.

Generally speaking, there are two kinds of Colpitts voltage controlled oscillators in a dual-band circuit: one is the capacitor switched Colpitts voltage controlled oscillator, and the other is the inductor switched Colpitts voltage controlled oscillator.

FIG. 1 shows a capacitor switched Colpitts voltage controlled oscillator 100. It includes a first switch device 120, a second switch device 130, an inductor 170, a capacitor 160, a current source 190, a first N-type transistor 102, a second N-type transistor 103, a third N-type transistor 104, two capacitors 140, 150, and a variable capacitor 180.

When we change the capacitances of the capacitors 140, 150 in the resonance cavity, the oscillating frequency of the oscillator also changes accordingly. As we switch between the switch devices 120, 130 in the switching circuit 110, we obtain different equivalent capacitances, thereby obtaining different oscillating frequency bands. This enables the oscillator to work in the desired bands.

However, such a circuit design has a big flaw. That is, it is impossible to obtain optimized inductance and capacitance in the bands. For example, if the inductance and capacitance in the resonance circuit are designed for the resonance frequency in a higher band, the equivalent capacitance has to be increased in order to obtain a lower frequency. Therefore, a lot of parasite capacitors with fixed values have to used, resulting in the decrease in the tunable high-frequency band. This also increases the power consumption and lowers the quality factor Q (Q factor) of the resonance cavity at the same time.

FIG. 2 depicts an inductor switched Colpitts voltage controlled oscillator 200 with mainly the equivalent inductance inside the resonance cavity thereof. The inductor switched Colpitts voltage controlled oscillator 200 includes a switch device 220, another switch device 230, a first N-type transistor 201, a second N-type transistor 202, a third N-type transistor 203, two inductors 250, 240, a capacitor 260, a variable capacitor 280, and a current source 290. The basic design idea of this oscillator is to change the equivalent inductance using the switch devices. By switching between the switch device 220 and the switch device 230 of the switching circuit 210, different equivalent inductances can be obtained, thereby rendering different oscillating bands. This enables the oscillator to work in the desired bands.

However, the drawback of this circuit is that the inductor in the resonance cavity is the passive device with the worst Q factor. By connecting a switch device in series to the inductor will result in a parasite resistance in the switch device, affecting the overall Q factor. This seriously decreases the Q factor of the resonance cavity. The extra resistance and capacitance also increase the power consumption.

It is thus highly desirable to provide a wide-band voltage controlled oscillator that can solve the above-mentioned problems.

SUMMARY OF THE INVENTION

An objective of the invention is to provide an oscillator with a dual-band oscillating source that can simultaneously reduce the power consumption and phase noises.

The disclosed dual-band voltage controlled oscillator includes a switched-band switching circuit composed of a source loop-feedback switching circuit, an inductor array, an N-type transistor, and a P-type transistor, a circuit block offering a feedback loop, and a push circuit. The dual-band voltage controlled oscillator constitutes two feedback loops. Using the design of two feedback circuits, when the switching circuit is switched to a high voltage a first feedback loop of the two parallel feedback voltage controlled oscillator circuits is conductive and working whereas the second feedback loop is not conductive (i.e. not oscillating). The oscillating signal is thus provided by the resonance cavity with the first feedback loop. On the other hand, if the switching circuit is switched to a low voltage, then the second feedback loop is conductive and the first feedback loop is not. The oscillating signal is then determined by the resonance cavity of the second feedback loop. The two different feedback loops used in the invention can avoid extra parasite resistance and capacitance of the oscillating circuit. It may also greatly reduce the power consumption and phase noises of the circuit.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE INVENTION

The present invention will be apparent from the following detailed description, which proceeds with reference to the accompanying drawings, wherein the same references relate to the same elements.

Figure 1:
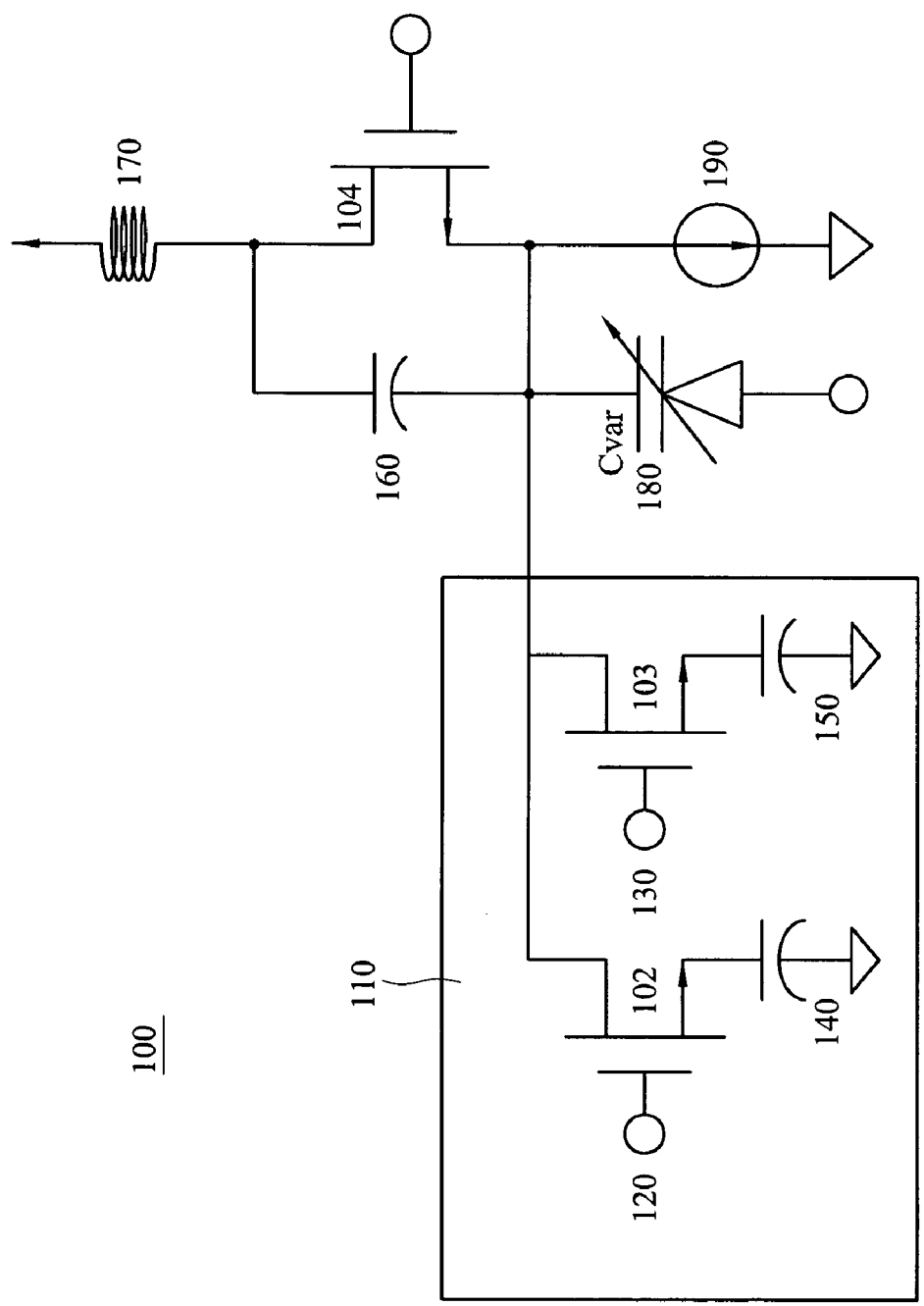
FIG. 1 is a circuit diagram of the capacitor-switched Colpitts voltage controlled oscillator.
Figure 2:
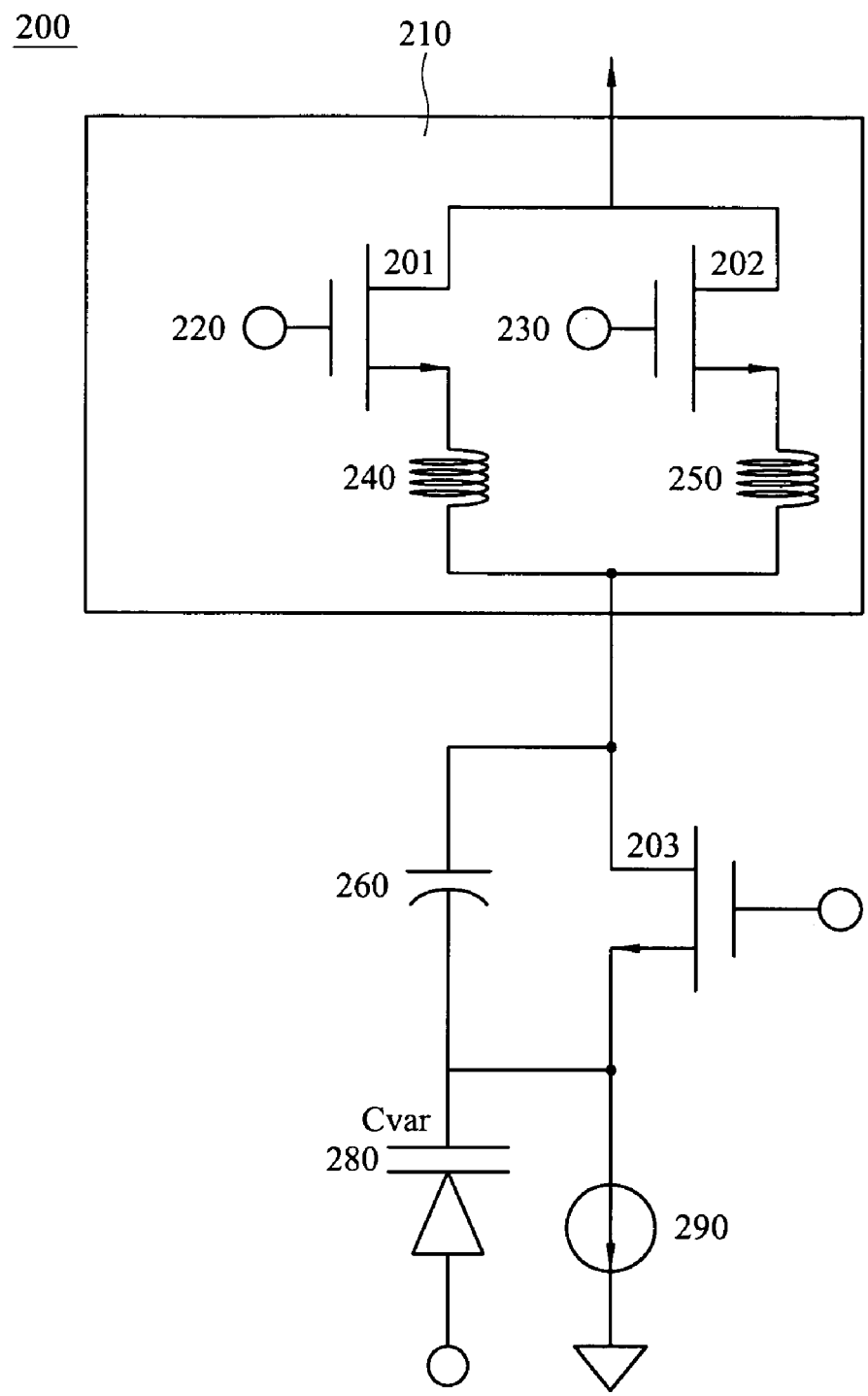
FIG. 2 is a circuit diagram of the inductor-switched Colpitts voltage controlled oscillator.
Figure 3:
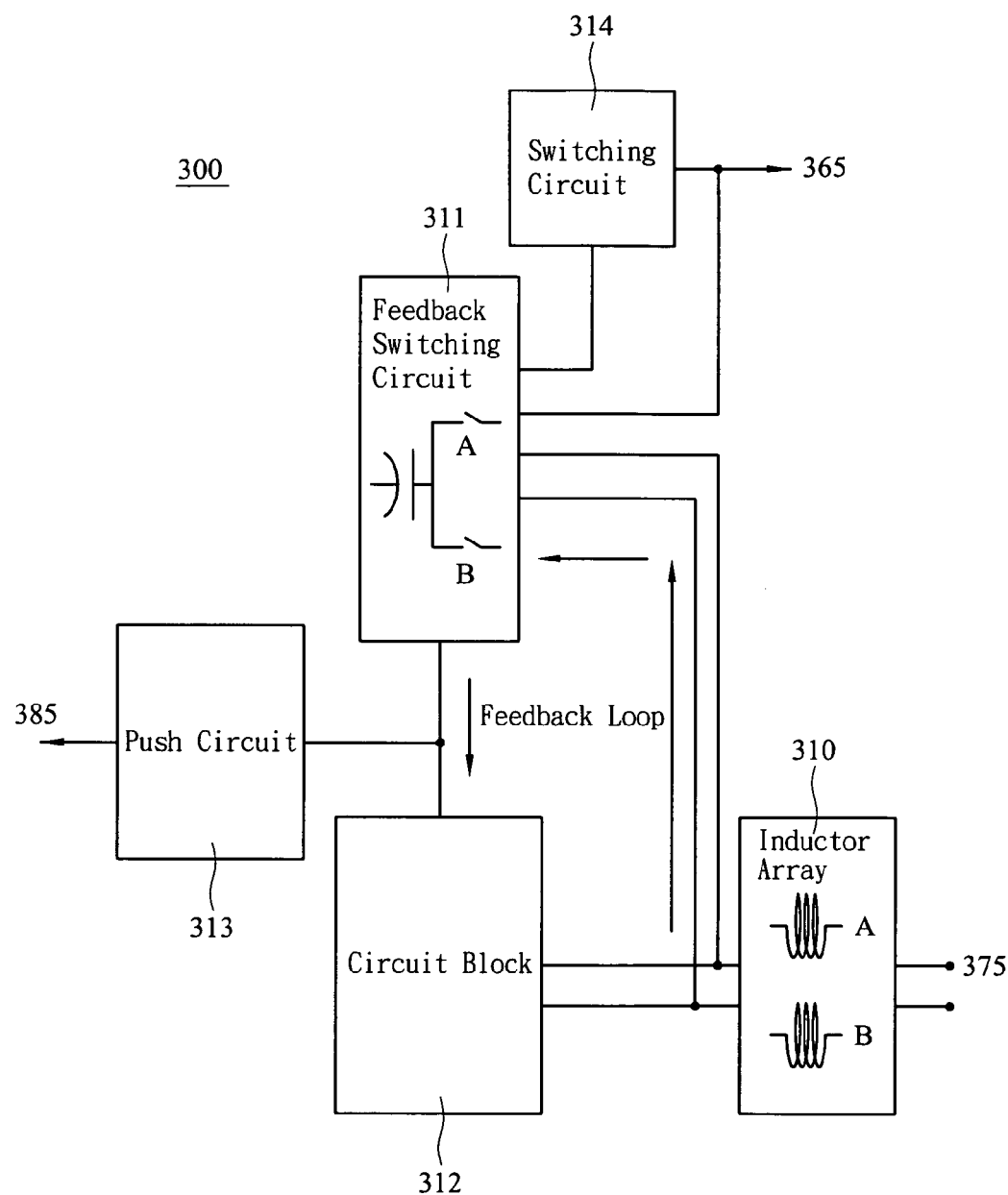
FIG. 3 is a block diagram of the dual-band voltage controlled oscillator according to the invention.

FIG. 3 depicts a preferred embodiment of the disclosed dual-band voltage controlled oscillator 300. It includes a feedback switching circuit 311, a switching circuit 314, a circuit block 312, an inductor array 310, and a push circuit 313.

The feedback switching circuit 314 is mainly an oscillating signal feedback loop of the dual-band oscillator 300. It includes two sets of source feedback loops, the first feedback loop A and the second feedback loop B. The switching circuit 314 comprised of an N-type transistor and a P-type transistor is coupled to the feedback switching circuit 311 on one end and to the switching circuit 365 and the feedback switching circuit 311 simultaneously on the other end. It is used to switch the oscillating signal feedback loop of the dual-band voltage controlled oscillator 300. The circuit block 312 is coupled to the feedback switching circuit 311 for providing a common active load. The inductor array 310 is coupled to a DC bias 375 on one end and to the circuit block 312 and the feedback switch circuit 311 simultaneously on the other end for providing the inductance of the feedback loop resonance cavity. The push circuit 313 is simultaneously coupled to the feedback switching circuit 311 and the circuit block 312 for pushing the oscillating signal to the output terminal 385.

With the above-mentioned circuit design, the feedback loop A is conductive and working when the input of the switching circuit 314 is at a high voltage whereas the feedback loop B is not conductive (i.e., not oscillating). The oscillating signal is provided by the resonance cavity composed of the feedback loop A and the inductor A. On the other hand, if the input of the switching circuit 314 is at a low voltage, the feedback loop B is conductive and working whereas the feedback loop B is not conductive. The oscillating signal is provided by the resonance cavity composed of the feedback loop B and the inductor B.

The two feedback oscillator loops in this embodiment are designed to work in the desired bands. Therefore, an appropriate oscillating band can be selected by switching the switching circuit. Since the two feedback voltage controlled oscillators can be designed independently, the two feedback loops do not interfere with each other. They can be designed to have optimized oscillator characteristics without sacrificing important characteristic parameters thereof, such as the phase noises.

Figure 4:
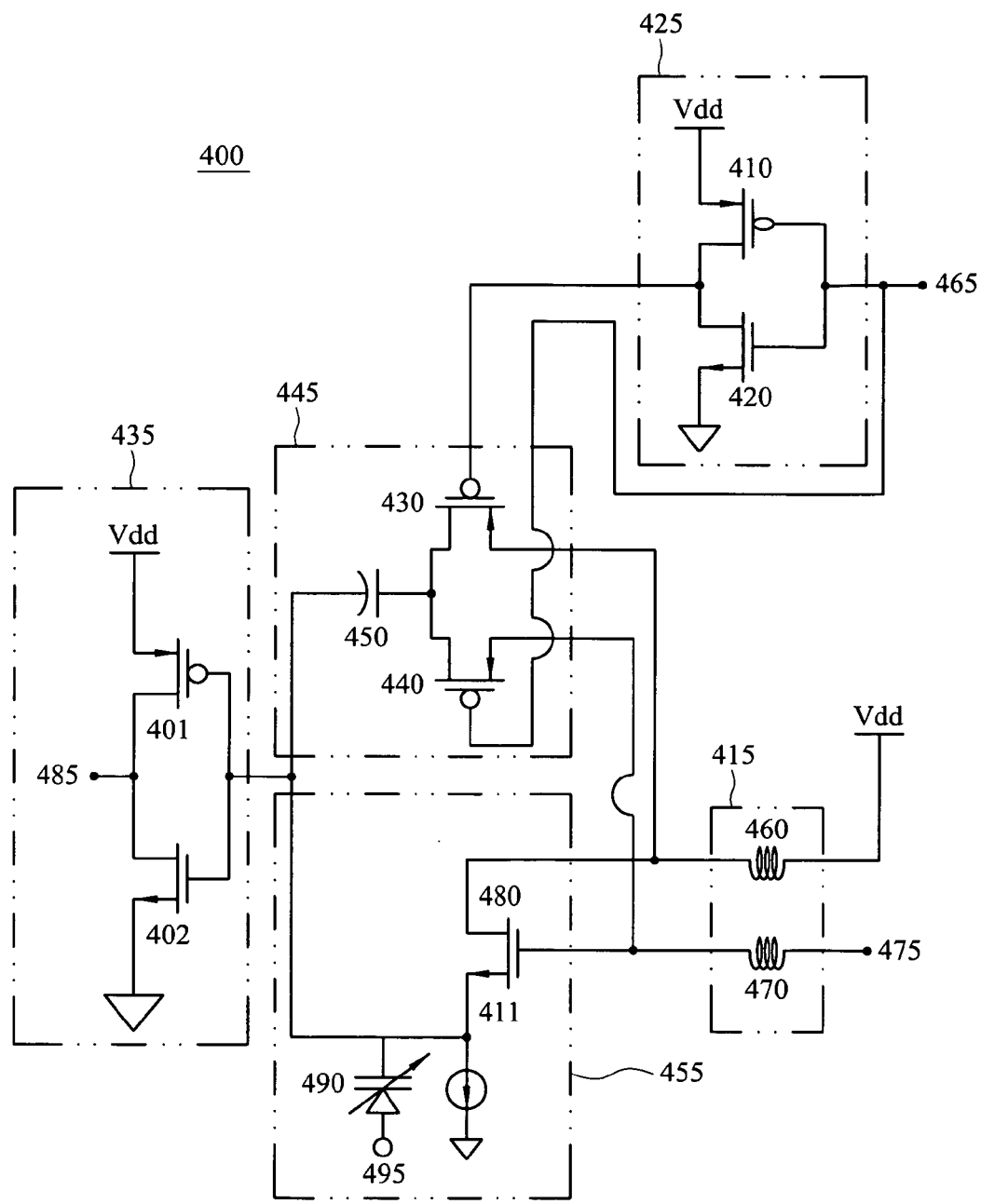
FIG. 4 is a circuit diagram of the dual-band voltage controlled oscillator according to a preferred embodiment of the invention.

With reference to FIG. 4, a preferred embodiment of the dual-band oscillator circuit includes a circuit block 455, a feedback switching circuit 445, a switching circuit 425, an inductor array 415, and a push circuit 435. The circuits in this embodiment are elucidated as follows:

The circuit block 455 includes a current source 411, a variable capacitor 490, and a second N-type transistor 480. The anode of the variable capacitor 490 is connected to a frequency modulating end 495. One end of the current source 411 is coupled to the cathode of the variable capacitor 490. The other end of the current source 411 is coupled to a low voltage. The source of the second N-type transistor 480 is coupled to the cathode of the variable capacitor.

The push circuit 435 includes a first P-type transistor 401 and a first N-type transistor 402. The source of the first P-type transistor 401 is coupled to a high voltage Vdd. The source of the first N-type transistor 402 is grounded. The drain of the first N-type transistor 402 is coupled to the drain of the first P-type transistor 401 and to the output terminal 485. The gate of the first N-type transistor 402 is simultaneously coupled to the gate of the first P-type transistor 401 and the cathode of the variable capacitor 490.

The feedback switching circuit 425 includes a second P-type transistor 430, a third P-type transistor 440, and a capacitor 450. One end of the capacitor 450 is coupled to the gate of the first N-type transistor 402. The other end is simultaneously coupled to the drain of the second P-type transistor 430 and the drain of the third P-type transistor 440.

The inductor array 415 includes a first inductor 460 and a second inductor 470. One end of the first inductor 460 is coupled to the high voltage Vdd, while the other end is simultaneously coupled to the source of the second P-type transistor and the drain of the second N-type transistor 480. One end of the second inductor 470 is coupled to a DC bias 475, while the other end is simultaneously coupled to the source of the third P-type transistor and the gate of the second N-type transistor.

The switching circuit 425 includes a fourth P-type transistor 410 and a third N-type transistor 420. The source of the fourth P-type transistor is coupled to the high voltage Vdd. The gate of the third N-type transistor 420 is coupled to the gate of the fourth P-type transistor, a switching voltage end 465, and the gate of the third P-type transistor 440. Its source is coupled to the low voltage, and its drain is simultaneously coupled to the drain of the fourth P-type transistor 410 and the gate of the second P-type transistor 430.

The above-described circuit structure forms a preferred embodiment of the invention. It includes two feedback circuits. The first feedback circuit is a Colpitts circuit A consisting of the first inductor 460, the second P-type transistor 430, the capacitor 450, the variable capacitor 490 for modulating frequencies, and the second N-type transistor 480 for providing negative impedance. The second feedback circuit is a Colpitts circuit A consisting of the second inductor 470, the third P-type transistor 440, the capacitor 450, the variable capacitor 490 for modulating frequencies, and the second N-type transistor 480 for providing negative impedance.

The second P-type transistor 430 and the third P-type transistor 440 are the switch devices controlling whether the source feedback loops of the two oscillators exist. When the second P-type transistor 430 is conductive, the source feedback loop of the Colpitts A exists and there is a continuous oscillating signal. On the other hand, when the third P-type transistor 440 is conductive, the source feedback loop of the Colpitts circuit B exists.

Therefore, when the switching voltage end 465 receives a high voltage, the switching circuit consisting of the fourth P-type transistor 410 and the third N-type transistor 420 outputs a low voltage. The second P-type transistor 430 is conductive because of this low voltage. Therefore, the feedback loop of the Colpitts circuit A exists, and the resonance signal generated by the resonance cavity can be continuously produced. The third P-type transistor 440 is not conductive because it receives a high voltage. Therefore, the feedback loop of the Colpitts circuit B does not exist.

On the other hand, when the switching voltage end 465 receives a low voltage, the switching circuit consisting of the fourth P-type transistor 410 and the third N-type transistor 420 outputs a high voltage. The third P-type transistor 440 is conductive because it receives the low voltage. Thus, the feedback loop of the Colpitts circuit B exists, and the resonance signal generated by the resonance cavity can be continuously produced. The second P-type transistor 430 is not conductive because it receives the high voltage. Therefore, the feedback loop of the Colpitts circuit A does not exist.

According to the above description, the switch control circuit 425 consisting of the fourth P-type transistor 410 and the third N-type transistor 420 and the feedback switching circuit 445 consisting of the second P-type transistor 430 and the third P-type transistor 440 enables the two Colpitts circuits to share the same second N-type transistor 480 and the variable capacitor 490 for fine-tuning frequencies without interfering with each other. Such a circuit design does not seriously affect the phase noises of the oscillating circuit because of the additional switching circuit. By sharing the same second N-type transistor 480, the consumed current is controlled to remain the same.

Figure 5:
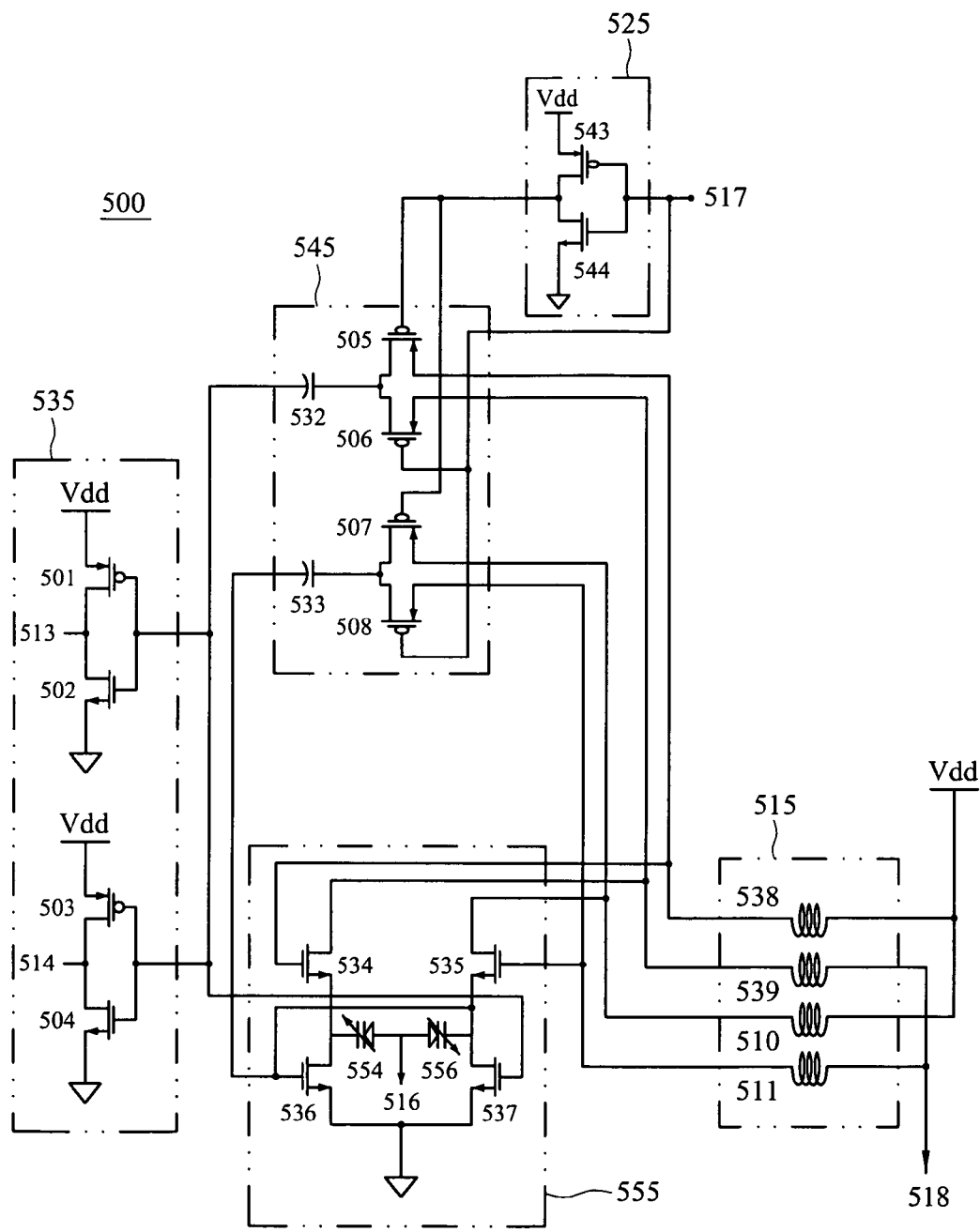
FIG. 5 is a circuit diagram of the dual-band voltage controlled oscillator according to a second embodiment of the invention.

As shown in FIG. 5, the dual-band oscillating circuit 500 according another embodiment of the invention includes a circuit block 555, a feedback switching circuit 545, a switching circuit 525, an inductor array 515, and a push circuit 535. The structure of FIG. 5 is roughly the same as the embodiment of FIG. 4. The difference is in that the single output of the dual-band oscillator in FIG. 4 is replaced by a differential output in this embodiment. The differential oscillation refers to the differential oscillating signal generated by the coupled two N-type transistors. Besides, a second inductor 539 and a third inductor 510 can be considered as a mutual inductance device A. A first inductor 538 and a fourth inductor 511 can also be considered as a mutual inductance device B. This can enhance the differential oscillating signal. The circuit composition of this embodiment is described as follows.

The circuit block 555 includes a third N-type transistor 535, a fourth N-type transistor 534, a fifth N-type transistor 537, a sixth N-type transistor 536, a first variable capacitor 554, and a second variable capacitor 556. The gate of the fifth N-type transistor 537 is coupled to the source of the fourth N-type transistor 534. The drain of the fifth N-type transistor 537 is simultaneously coupled to the source of the third N-type transistor 535, the gate of the sixth N-type transistor 536 and the cathode of the second variable capacitor 556. The drain of the sixth N-type transistor 536 is coupled to the source of the fourth N-type transistor 534 and the cathode of the first variable capacitor 554. Its source is simultaneously coupled to the source of the fifth N-type transistor 537 and a low voltage. The anode of the first variable capacitor 554 and the anode of the second variable capacitor 556 are simultaneously coupled to a frequency tuning end 516.

The push circuit 535 includes a first P-type transistor 501, a second P-type transistor 503, a first N-type transistor 502, and a second N-type transistor 504. The source of the first P-type transistor 501 and the source of the second P-type transistor 503 are simultaneously coupled to a high voltage Vdd. The source of the first N-type transistor 502 and the source of the second N-type transistor 504 are simultaneously coupled to a low voltage. Their drains are simultaneously coupled to the drain of the first P-type transistor 501 and a first output end 513. The gates are simultaneously coupled to the gate of the first P-type transistor 501 and the gate of the second N-type transistor 504. The drain of the N-type transistor 504 is simultaneously coupled to the drain of the second P-type transistor 503 and a second output end 514. The gate of the N-type transistor 504 is simultaneously coupled to the gate of the second P-type transistor 503 and the source of the fourth N-type transistor 534.

The feedback switching circuit 545 includes a third P-type transistor 505, a fourth P-type transistor 506, a fifth P-type transistor 507, a sixth P-type transistor 508, a first capacitor 532, and a second capacitor 533. The drain of the fourth P-type transistor 506 is coupled to the drain of the third P-type transistor 505. The drain of the fifth P-type transistor 507 is coupled to the drain of the sixth P-type transistor 508. One end of the first capacitor 532 is coupled to the drain of the fourth P-type transistor 506, whereas the other end is coupled to the gate of the first N-type transistor 502. One end of the second capacitor 533 is coupled to the drain of the sixth P-type transistor 508, whereas the other end is coupled to the gate of the sixth N-type transistor 536.

The switching circuit 525 includes a seventh P-type transistor 543 and a seventh N-type transistor 544. The source of the seventh P-type transistor 543 is coupled to the high voltage Vdd, its source is coupled to the low voltage, and its gate is simultaneously coupled to the switching voltage end 517, the gate of the fourth P-type transistor 506, the gate of the sixth P-type transistor 508, and the gate of the seventh P-type transistor 543. The drain of the seventh N-type transistor 544 is coupled to the drain of the seventh P-type transistor 543, the gate of the fifth P-type transistor 507, and the gate of the third P-type transistor 505.

The inductor array 515 includes a first inductor 538, a second inductor 539, a third inductor 510, and a fourth inductor 511. One end of the first inductor 538 is coupled to the high voltage Vdd, while the other end is simultaneously coupled to the gate of the fourth N-type transistor 534 and the source of the third P-type transistor 505. One end of the second inductor 539 is coupled to a DC bias 518, while the other end is simultaneously coupled to the drain of the fourth N-type transistor 534 and the source of the fourth P-type transistor 506. One end of the third inductor 510 is coupled to the high voltage Vdd, while the other end is simultaneously coupled to the drain of the third N-type transistor 535 and the source of the fifth P-type transistor 507. One end of the fourth inductor 511 is coupled to the DC bias 518, while the other end is simultaneously coupled to the gate of the third N-type transistor 535 and the source of the sixth P-type transistor 508.

Figure 6:
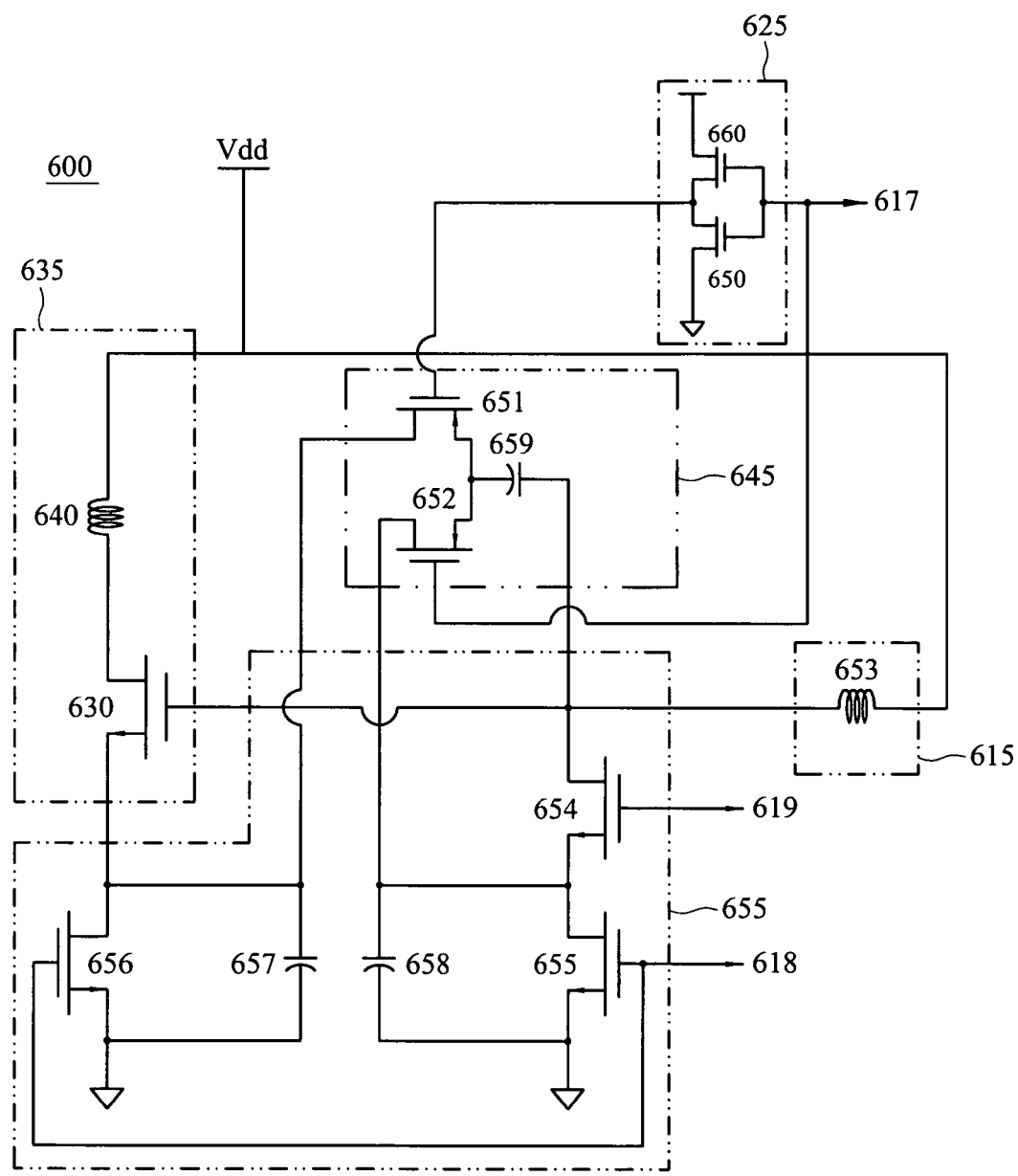
FIG. 6 is a circuit diagram of the dual-band voltage controlled oscillator according to a third embodiment of the invention.

FIG. 6 depicts the circuit diagram of the dual-band oscillator 600 according to yet another embodiment of the invention. Its basic operating principles are the same as that in FIG. 4. The only difference is that the feedback loop in this embodiment is different from that in FIG. 4. The circuit of this embodiment is described as follows.

The circuit block 655 includes a first N-type transistor 654, a second N-type transistor 655, a third N-type transistor 656, a first capacitor 657, and a second capacitor 658. The gate of the first N-type transistor 654 is coupled to a first DC bias 619. The drain of the second N-type transistor 655 is coupled to the source of the first N-type transistor 654. The source of the second N-type transistor 655 is coupled to a low voltage, and its gate is simultaneously coupled to a second DC bias 618 and the gate of the third N-type transistor 656. The source of the third N-type transistor 656 is coupled to the low voltage. One end of the first capacitor 657 is coupled to the drain of the third N-type transistor 656, while the other end is coupled to the source of the third N-type transistor 656. One end of the second capacitor 658 is coupled to the drain of the second N-type transistor 655, while the other end is coupled to the source of the second N-type transistor 655.

The push circuit 635 includes a fifth N-type transistor 630 and a first inductor 640. The source of the fifth N-type transistor 630 is coupled to the drain of the third N-type transistor 656. The gate of the fifth N-type transistor 630 is coupled to the drain of the first N-type transistor 654. One end of the first inductor 640 is coupled to the drain of the fifth N-type transistor 630, while the other end is coupled to the high voltage Vdd.

The feedback switching circuit 645 includes a first P-type transistor 651, a second P-type transistor 652, and a third capacitor 659. The drain of the first P-type transistor 651 is coupled to the drain of the third N-type transistor 659. The source of the second P-type transistor 652 is coupled to the source of the first P-type transistor 651. The drain is coupled to the drain of the second N-type transistor 655. One end of the third capacitor 659 is coupled to the drain of the second P-type transistor 652, while the other end is coupled to the drain of the first N-type transistor.

The switching circuit 625 includes a third P-type transistor 660 and a fourth N-type transistor 650. The source of the third P-type transistor 660 is coupled to the high voltage Vdd. The gate of the fourth N-type transistor 650 is coupled to the gate of the third P-type transistor 660, a control voltage end 617 and the gate of the second P-type transistor 652. Its source is coupled to the low voltage, and its drain is coupled to the drain of the third P-type transistor 660 and the gate of the first P-type transistor 651.

The inductor array 615 includes a second inductor 653. One end of the second inductor 653 is coupled to the drain of the first N-type transistor 654, and the other end is coupled to the high voltage Vdd.

The oscillating circuit consists of a first feedback circuit A and a second feedback circuit B. The first feedback circuit A is comprised of a second inductor 653, a third capacitor 659, a first P-type transistor 651, and a first capacitor 657. The second feedback loop B is comprised of a second inductor 653, a third capacitor 659, a second P-type transistor 652, and a second capacitor 658. With different capacitances of the first capacitor 657 and the second capacitor 658, the feedback switching circuit 645 achieves the goal of dual bands using the first P-type transistor 651 and the second P-type transistor 652.

In accord with the above-mentioned embodiments, a primary objective of the invention is to provide an oscillator with a dual-band oscillating source for simultaneously reducing power consumption and phase noises. The dual-band voltage controlled oscillator consists of two feedback loops. Using such a design, when the input of the switching circuit is at a high voltage, one of the feedback loops is conductive while the other is not working. The oscillating signal is provided by the resonance cavity of the first feedback loop. On the other hand, if the input of the switching circuit is at a low voltage, the second feedback loop is conductive while the first feedback loop is not working. The oscillating signal is thus provided by the resonance cavity of the second feedback loop.

The two different feedback loops used for switching does not only avoid additional parasite resistance and capacitance, but also greatly reduce power consumption and phase noises.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A dual-band voltage controlled oscillator, comprising:
    a feedback switching circuit, which provides a feedback loop of an oscillating signal of the dual-band oscillator;
    a switching circuit, which switches the feedback loop of the oscillating signal of the dual-band oscillator and has one end coupling to the feedback switching circuit and the other end coupling to the feedback switching circuit and a switching voltage end;
    a circuit block, which provides an active load for each feedback loop and is coupled to the feedback switching circuit;
    an inductor array, which provides a resonance inductance to each feedback loop and has one end coupling to a DC bias and the other simultaneously coupling to the circuit block and the feedback switching circuit; and
    a push circuit, which transmits the oscillating signal to an output end and is coupled simultaneously to the feedback switching circuit and the circuit block.

2. The dual-band voltage controlled oscillator of claim 1, wherein the circuit block includes:
    a variable capacitor, whose anode is coupled to a frequency tuning end;
    a current source, whose one end is coupled to the cathode of the variable capacitor and whose other end is coupled to a low voltage; and
    a second N-type transistor, whose source is coupled to the cathode of the variable capacitor.

3. The dual-band voltage controlled oscillator of claim 2, wherein the push circuit includes:
    a first P-type transistor, whose source is coupled to a high voltage; and
    a first N-type transistor, whose source is coupled to the low voltage, whose drain is coupled to the drain of the first P-type transistor and an output end, and whose gate is simultaneously coupled to the gate of the first P-type transistor and the cathode of the variable capacitor.

4. The dual-band voltage controlled oscillator of claim 3, wherein the feedback circuit includes:
    a second P-type transistor;
    a third P-type transistor; and
    a capacitor, whose one end is coupled to the gate of the first N-type transistor and whose other end is simultaneously coupled to the drain of the second P-type transistor and the drain of the third P-type transistor.

5. The dual-band voltage controlled oscillator of claim 4, wherein the switching circuit includes:
    a fourth P-type transistor, whose source is coupled to the high voltage; and
    a third N-type transistor, whose gate is coupled to the gate of the fourth P-type transistor, the gate of the third P-type transistor, and a switching voltage end, whose source is coupled to the low voltage, and whose drain is simultaneously coupled to the drain of the fourth P-type transistor and the gate of the second P-type transistor.

6. The dual-band voltage controlled oscillator of claim 1, wherein the inductor array includes:
    a first inductor, whose one end is coupled to the high voltage and whose other end is simultaneously coupled to the source of the second P-type transistor and the drain of the second N-type transistor; and
    a second inductor, whose one end is coupled to a DC bias and whose other end is coupled to the source of the third P-type transistor and the gate of the second N-type transistor.

7. The dual-band voltage controlled oscillator of claim 1, wherein the circuit block includes:
    a third N-type transistor;
    a fourth N-type transistor;

a fifth N-type transistor, whose drain is coupled to the source of the third N-type transistor;

a sixth N-type transistor, whose drain is coupled to the source of the fourth N-type transistor and the gate of the fifth N-type transistor, whose source is coupled to the source of the fifth N-type transistor and a low voltage, and whose gate is coupled to the drain of the fifth N-type transistor;

a first variable capacitor, whose cathode is coupled to the drain of the sixth N-type transistor and whose anode is coupled to the frequency tuning end; and a second variable capacitor, whose anode is coupled to the drain of the fifth N-type transistor and whose anode is coupled to the frequency tuning end.

8. The dual-band voltage controlled oscillator of claim 7, wherein the push circuit includes:

a first P-type transistor, whose source is coupled to a high voltage;

a second P-type transistor, whose source is coupled to the high voltage;

a first N-type transistor, whose source is coupled to the low voltage, whose drain is coupled to the drain of the first P-type transistor and a first output end, and whose gate is simultaneously coupled to the gate of the first P-type transistor, the source of the fourth N-type transistor, and the gate of the fifth N-type transistor; and a second N-type transistor, whose source is coupled to the low voltage, whose drain is simultaneously coupled to the drain of the second P-type transistor and a second output end, and whose gate is simultaneously coupled to the gate of the second P-type transistor and the source of the fourth N-type transistor.

9. The dual-band voltage controlled oscillator of claim 8, wherein the feedback switching circuit includes:

a third P-type transistor;

a fourth P-type transistor, whose drain is coupled to the drain of the third P-type transistor;

a fifth P-type transistor, whose drain is coupled to the drain of the sixth P-type transistor;

a sixth P-type transistor;

a first capacitor, whose one end is coupled to the drain of the fourth P-type transistor and whose other end is coupled to the gate of the first N-type transistor; and a second capacitor, whose one end is coupled to the drain of the sixth P-type transistor and whose other end is coupled to the gate of the sixth N-type transistor.

10. The dual-band voltage controlled oscillator of claim 9, wherein the switching circuit includes:

a seventh P-type transistor, whose source is coupled to the high voltage; and a seventh N-type transistor, whose gate is coupled to the gate of the seventh P-type transistor, a switching voltage end, the gate of the fourth P-type transistor, and the gate of the sixth P-type transistor, whose source is coupled to the low voltage, and whose drain is coupled to the drain of the seventh P-type transistor, the gate of the fifth P-type transistor, and the gate of the third P-type transistor.

11. The dual-band voltage controlled oscillator of claim 10, wherein inductor array includes:

a first inductor, whose one end is coupled to the high voltage and whose other end is simultaneously coupled to the gate of the fourth N-type transistor and the source of the third P-type transistor;

a second inductor, whose one end is coupled to a DC bias and whose other end is simultaneously coupled to the drain of the fourth N-type transistor and the source of the fourth P-type transistor;

a third inductor, whose one end is coupled to the high voltage and whose other end is simultaneously coupled to the drain of the third N-type transistor and the source of the fifth P-type transistor; and a fourth inductor, whose one end is coupled to the DC bias and whose other end is simultaneously coupled to the gate of the third N-type transistor and the source of the sixth P-type transistor.

12. The dual-band voltage controlled oscillator of claim 1, wherein the circuit block includes:

a first N-type transistor, whose gate is coupled to a first DC bias;

a second N-type transistor, whose drain is coupled to the source of the first N-type transistor, whose source is coupled to a low voltage, and whose gate is coupled to a second DC bias;

a third N-type transistor, whose source is coupled to the low voltage and whose gate is coupled to the gate of the second N-type transistor;

a first capacitor, whose one end is coupled to the drain of the third N-type transistor and whose other end is coupled to the source of the third N-type transistor; and a second capacitor, whose one end is coupled to the drain of the second N-type transistor and whose other end is coupled to the source of the second N-type transistor.

13. The dual-band voltage controlled oscillator of claim 12, wherein the push circuit includes:

a fifth N-type transistor, whose source is coupled to the drain of the third N-type transistor and whose gate is coupled to the drain of the first N-type transistor;

a first inductor, whose one end is coupled to the drain of the fifth N-type transistor and whose other end is coupled to a high voltage.

14. The dual-band voltage controlled oscillator of claim 13, wherein the feedback switching circuit includes:

a first P-type transistor, whose drain is coupled to the drain of the third N-type transistor;

a second P-type transistor, whose source is coupled to the source of the first P-type transistor and whose drain is coupled to the drain of the second N-type transistor;

a third capacitor, whose one end is coupled to the drain of the second P-type transistor and whose other end is coupled to the drain of the first N-type transistor.

15. The dual-band voltage controlled oscillator of claim 14, wherein the switching circuit includes:

a third P-type transistor, whose source is coupled to the high voltage; and a fourth N-type transistor, whose gate is simultaneously coupled to the control voltage end, the gate of the second P-type transistor and the gate of the third P-type transistor, whose source is coupled to the low voltage, and whose drain is simultaneously coupled to the drain of the third P-type transistor and the gate of the first P-type transistor.

16. The dual-band voltage controlled oscillator of claim 15, wherein the inductor array includes a second inductor whose one end is coupled to the drain of the first N-type transistor and whose other end is coupled to the high voltage.

* * * * *